(12) United States Patent
Kang

(10) Patent No.: US 6,690,600 B1
(45) Date of Patent: Feb. 10, 2004

(54) FERROELECTRIC MEMORY DEVICE AND PROGRAMMING METHOD THEREOF

(75) Inventor: Hee Bok Kang, Daejeon (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/330,197

(22) Filed: Dec. 30, 2002

(30) Foreign Application Priority Data

Aug. 30, 2002 (JP) ......................................... 2002-51932

(51) Int. Cl.[7] .............................................. G11C 11/22
(52) U.S. Cl. ............. 365/145; 365/185.07; 365/185.09; 365/185.23; 365/185.26; 365/189.07; 365/189.09; 365/230.06
(58) Field of Search ..................... 365/145, 185.09, 365/185.23, 189.07, 185.26, 189.09, 230.06

(56) References Cited

U.S. PATENT DOCUMENTS 5,995,406 A * 11/1999 Kraus et al. ................. 365/145
6,381,172 B2 * 4/2002 Banks ................... 365/185.03

* cited by examiner

Primary Examiner—Richard Elms
Assistant Examiner—Pho M. Luu
(74) Attorney, Agent, or Firm—Jacobson Holman PLLC

(57) ABSTRACT

A ferroelectric memory devices including a reference programming portion for regulating and outputting voltages of reference level control signals by using a programmable register, which programs the level of output signal with externally applied signals and maintains the program results without power, to control on/off of switches regulating capacitance of capacitors connected to driving power; and a reference voltage generating portion for outputting a reference voltage according to the reference level control signal.

A method for programming the ferroelectric memory device is also disclosed which includes the steps of: decoding a signal inputted in a signal input unit; activating a program mode operating signal corresponding to the program mode and deactivating the signal input unit; and performing the program mode in response to the program mode operating signal.

20 Claims, 23 Drawing Sheets

FERROELECTRIC MEMORY DEVICE AND PROGRAMMING METHOD THEREOF

BACKGROUND OF THE INVENTION

1. Field of the Invention

The present invention generally relates to ferroelectric memory devices, and more specifically, to a ferroelectric memory device which comprises a reference generator for regulating the level of reference voltage by using a programmable register, which programs the level of output signal by externally applied signals and maintains the program result without power, to control the on/off of switches regulating the capacitance of capacitors connected to driving power and a redundant decoder using the programmable register as on/off controller of a switch for programming redundant address program.

2. Description of the Background Art

Generally, a ferroelectric random access memory (hereinafter, referred to as 'FRAM') has attracted considerable attention as next generation memory device because it has a data processing speed as fast as a DRAM and conserves data even after the power is turned off.

The FRAM includes capacitors similar to the DRAM, but the capacitors have a ferroelectric substance for utilizing the characteristic of a high residual polarization of the ferroelectric substance in which data is not low even after eliminating an electric field applied thereto.

FIG. 1 is a characteristic curve illustrating a hysteresis loop of a general ferroelectric substance. As shown in FIG. 1, a polarization induced by an electric field does not vanish but keeps some strength ('d' or 'a' state) even after the electric field is cleared due to existence of a residual (or spontaneous) polarization. These 'd' and 'a' states may be assigned to binary values of '1' and '0' for use as a memory cell.

FIG. 2 is a structural diagram illustrating a unit cell of the FRAM device. As shown in FIG. 2, the unit cell of the conventional FRAM is provided with a bitline B/L arranged in one direction and a wordline W/L arranged in another direction vertical to the bitline B/L. A plateline P/L is arranged parallel to the wordline and spaced at a predetermined interval. The unit cell is also provided with a transistor Ti having a gate connected to an adjacent wordline W/L and a source connected to an adjacent bitline B/L, and a ferroelectric capacitor FC1 having the first terminal of the two terminals connected to the drain terminal of the transistor T1 and the second terminal of the two terminals connected to the plateline P/L.

The data input/output operation of the conventional FRAM is now described as follows. FIG. 3a is a timing diagram illustrating a write mode of the FRAM while FIG. 3b is a timing diagram illustrating a read mode of the FRAM.

Referring to FIG. 3a, when a chip enable signal CSBpad applied externally transits from a high to low level and simultaneously a write enable signal WEBpad also transits from a high to low level, the array is enabled to start a write mode. Thereafter, when ah address is decoded in a write mode, a pulse applied to a corresponding wordline transits from a "low" to "high" level, thereby selecting the cell.

In order to write a binary logic value "1" in the selected cell, a "high" signal is applied to a bitline while a "low" signal is applied to a plateline P/L. In order to write a binary logic value "0" in the cell, a "low" signal is applied to a bitline while a "high" signal is applied to a plateline P/L.

Referring to FIG. 3b, when a chip enable signal CSBpad externally transits from a "high" to "low" level, all bitlines are equalized to a "low" level by an equalization signal before selection of a required wordline.

After each bitline is deactivated, an address is decoded to transit a signal on the required wordline from a "low" to "high" level, thereby selecting a corresponding unit cell. A "high" signal is applied to a plateline of the selected cell to cancel a data Qs corresponding to the logic value "1" stored in the FRAM. If the logic value "0" is stored in the FRAM, a corresponding data Qns will not be destroyed.

The destroyed and non-destroyed data output different values, respectively, according to the above-described hysteresis loop characteristics. As a result, a sense amplifier senses logic values "1" or "0". In other words, as shown in the hysteresis loop of FIG. 1, the state moves from 'd'to 'f'when the data is destroyed while the state moves from 'a'to 'f'when the data is not destroyed.

As a result, the destroyed data amplified by the enabled sense amplifier outputs a logic value "1" while the non-destroyed data amplified by the sense amplifier outputs a logic value "0". After the sense amplifier amplifies the data, the data should be recovered into the original data. Accordingly, when a high' signal is applied to the required wordline, the plateline is disabled from "high" to "low".

There are problems in the conventional FRAM as follows. In a conventional reference voltage generating means, levels of output voltages are fixed when they are produced. In a redundancy processing method using conventional metal/polysilicon lines, or fuses may not be recovered because they are physically removed by using a laser cutting.

SUMMARY OF THE INVENTION

Accordingly, it is an object of the present invention to provide a reference generator for regulating a reference voltage by using a programmable register which can program its output signal with externally applied signals and maintain the program result without power to control on/off of switches regulating capacitance of capacitors connected to driving source.

It is another object of the present invention to provide a ferroelectric memory device which may easily recover an error by introducing a switch and a programmable register which controls the on/off of the switch into a redundant address decoder.

In order to achieve the above-described objects, there is provided a ferroelectric memory device, comprising: a reference programming means for regulating and outputting a reference level control signal whose voltage level can be programmed with the programmable register; and a reference voltage generating means for outputting a reference voltage according to the reference level control signal.

There is also provided a method of programming the ferroelectric memory device of the present invention, comprising the steps of: decoding signals inputted to a signal input unit; activating a program mode operating signal corresponding to a program mode and deactivating the signal input unit; and performing the program mode in response to the program mode operating signal.

DETAILED DESCRIPTION OF THE PREFERRED EMBODIMENTS

The present invention will be described in more detail with reference to the accompanying drawings.

Figure 1:
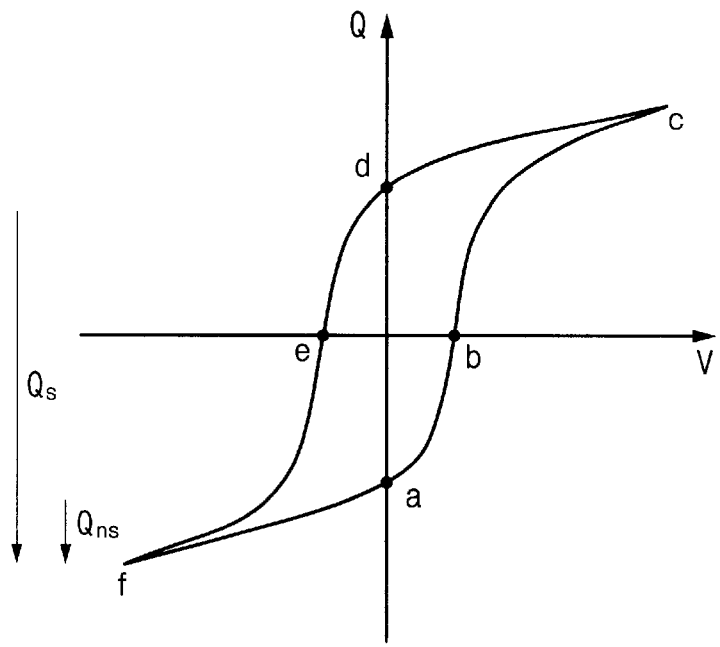
FIG. 1 is a characteristic curve illustrating a hysteresis loop of a general ferroelectric substance.
Figure 2:
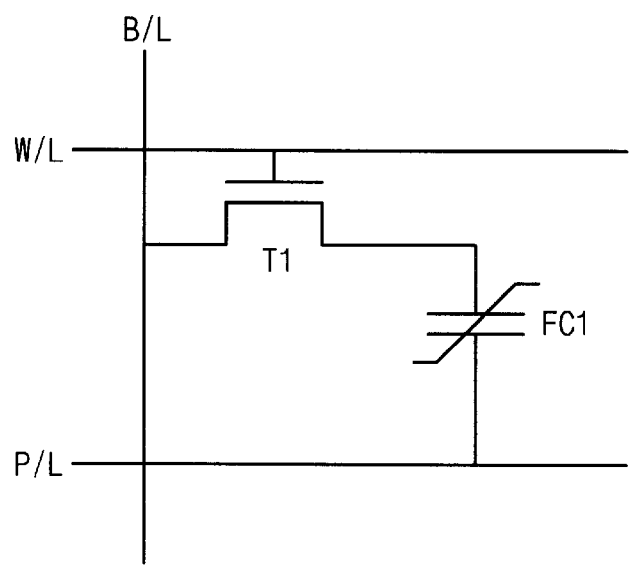
FIG. 2 is a structural diagram illustrating a FRAM cell device.
Figure 3A:
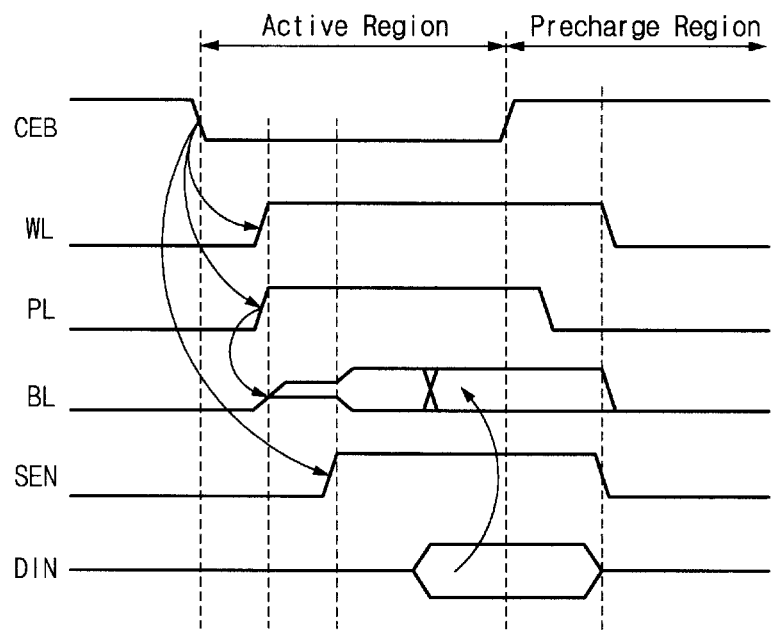
FIGS. 3a and 3b are timing diagrams of a conventional ferroelectric memory device.
Figure 3B:
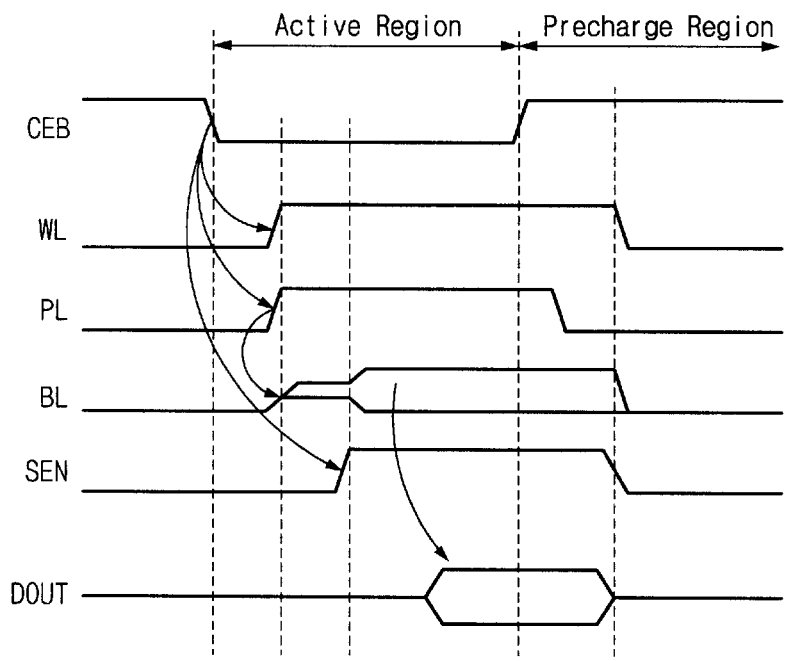
Figure 4:
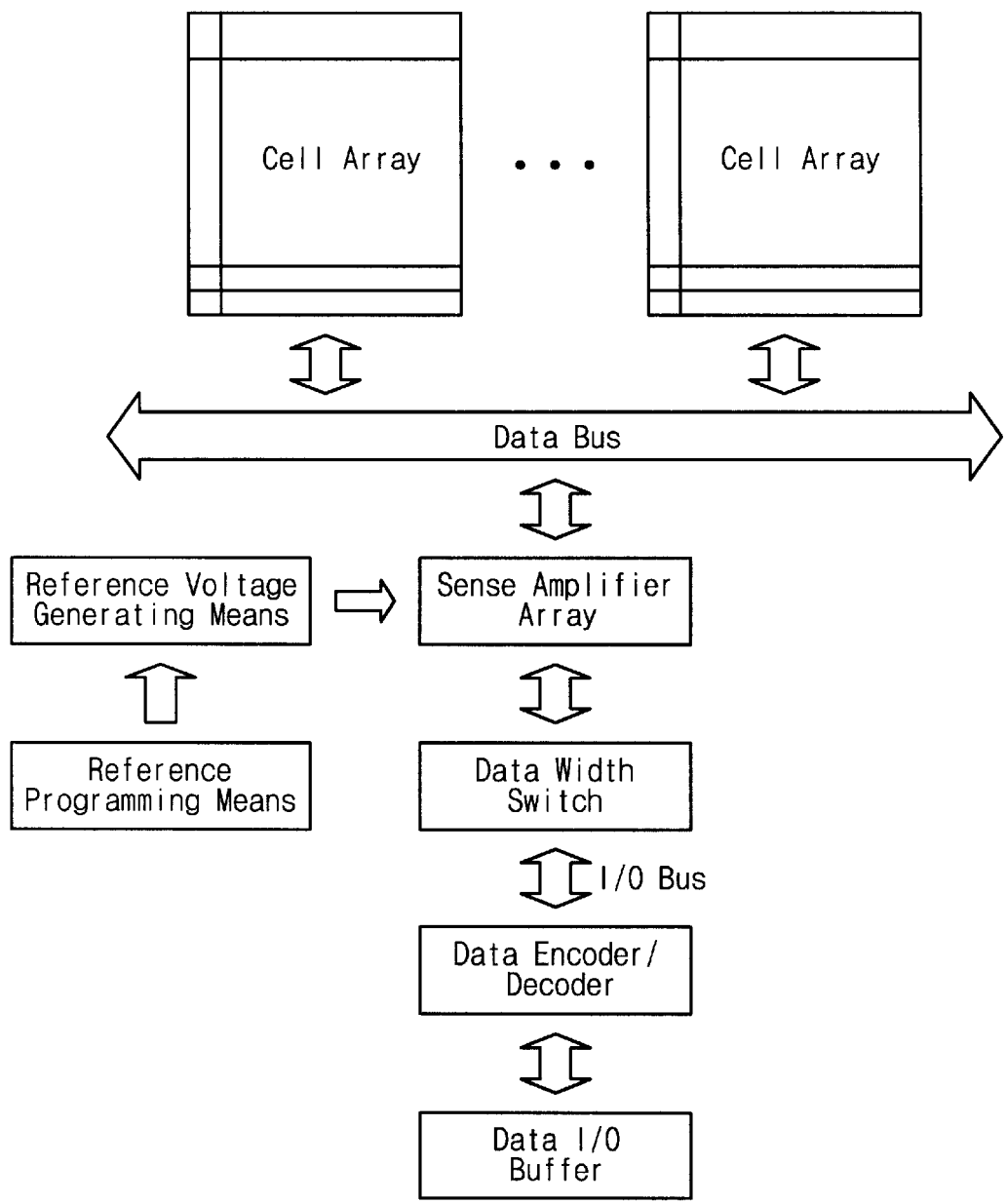
FIG. 4 is a structural diagram illustrating a ferroelectric memory device in accordance with a preferred embodiment of the present invention.

FIG. 4 is a structural diagram illustrating a ferroelectric memory device in accordance with a preferred embodiment of the present invention.

A reference voltage generating means supplies a reference voltage to a sense amplifier. During a read mode, the sense amplifier compares the reference voltage with voltages outputted from a bitline of a cell array and then outputs data corresponding to logic level of the cell data via data I/O buffers. During a write mode, the sense amplifier compares a reference voltage with voltage of the signal inputted from data I/O buffers and then supplies data corresponding to an inputted signal to a bitline of the cell.

Figure 5:
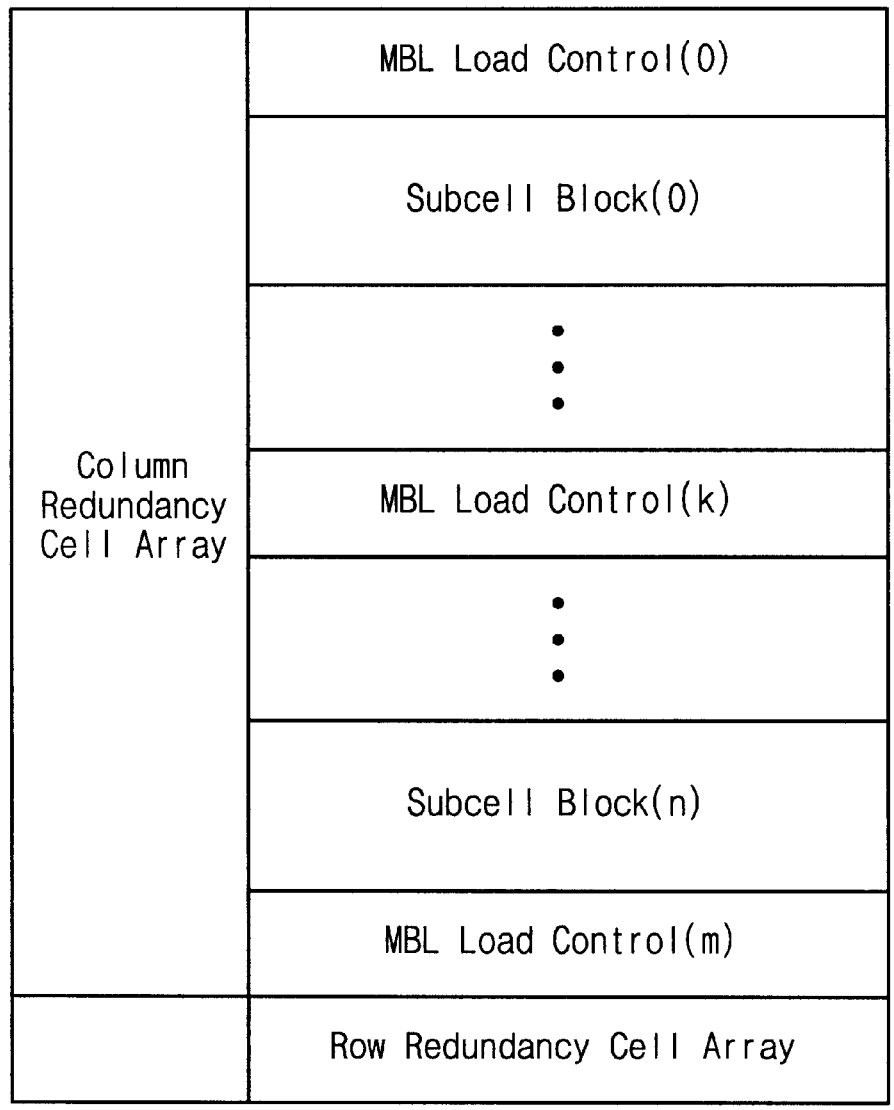
FIG. 5 is a structural diagram illustrating a cell array of the ferroelectric memory device in accordance with a preferred embodiment of the present invention.

FIG. 5 is a structural diagram illustrating a cell array shown in FIG. 4.

Each column of a cell array comprises a main bitline pull-up controller, a cell array, a column selection controller, a column redundancy cell array, a row redundancy cell array and a driving voltage generator (not shown) for comparing a predetermined threshold voltage with a detected power voltage and regulating a level of a driving voltage according to the comparison result.

The cell array includes one or more main bitline load controllers and a plurality of sub-cell blocks.

Figure 6:
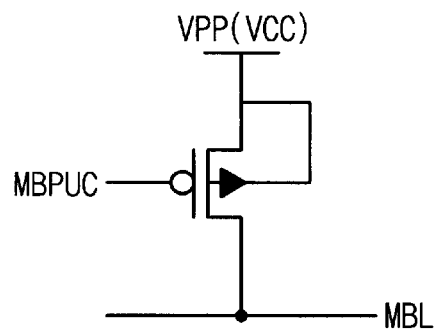
FIG. 6 is a structural diagram illustrating a main bitline pull-up controller of the ferroelectric memory device in accordance with a preferred embodiment of the present invention.

FIG. 6 is a structural diagram illustrating a main bitline pull-up controller.

The main bitline pull-up controller is provided with a PMOS transistor having a gate whereto a control signal MBPUC is inputted, a source connected to Vpp or Vcc and a drain connected to a main bitline.

The main bitline pull-up controller pulls up a main bitline to a "high" level during a "precharge".

Figure 7:
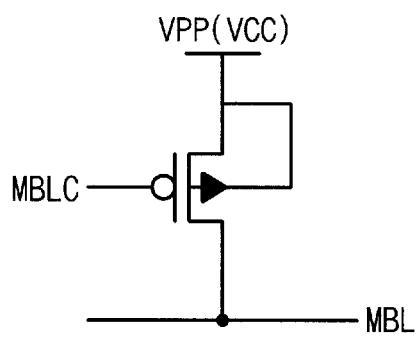
FIG. 7 is a structural diagram illustrating a main bitline load controller of the ferroelectric memory device in accordance with a preferred embodiment of the present invention.

FIG. 7 is a structural diagram illustrating a main bitline load controller.

The main bitline load controller comprises a PMOS transistor having a gate whereto a control signal MBLC is inputted, a source connected to Vpp or Vcc and a drain connected to a main bitline.

When the control signal MBLC is enabled, the main bitline load controller loads a main bitline MBL. A detection voltage of the main bitline MBL is determined by a load resistance and a current level of the main bitline MBL.

Each main bitline is connected to one or more main bitline load controllers. When more than one main bitline load controllers are connected to a main bitline, main bitline load controllers are arranged equally from each other with the same number of sub-cell blocks between them.

Figure 8:
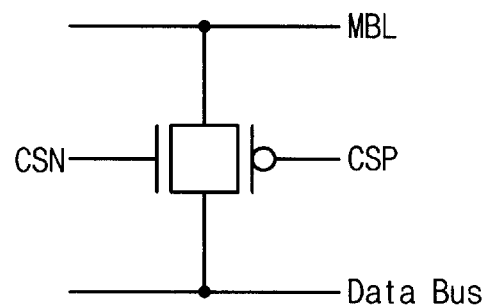
FIG. 8 is a structural diagram illustrating a column selection controller of the ferroelectric memory device in accordance with a preferred embodiment of the present invention.

FIG. 8 is a structural diagram illustrating a column selection controller.

The column selection controller connects or disconnects a main bitline MBL and a switch connecting a data bus controlled by column selection control signals CSN and CSP.

Figure 9:
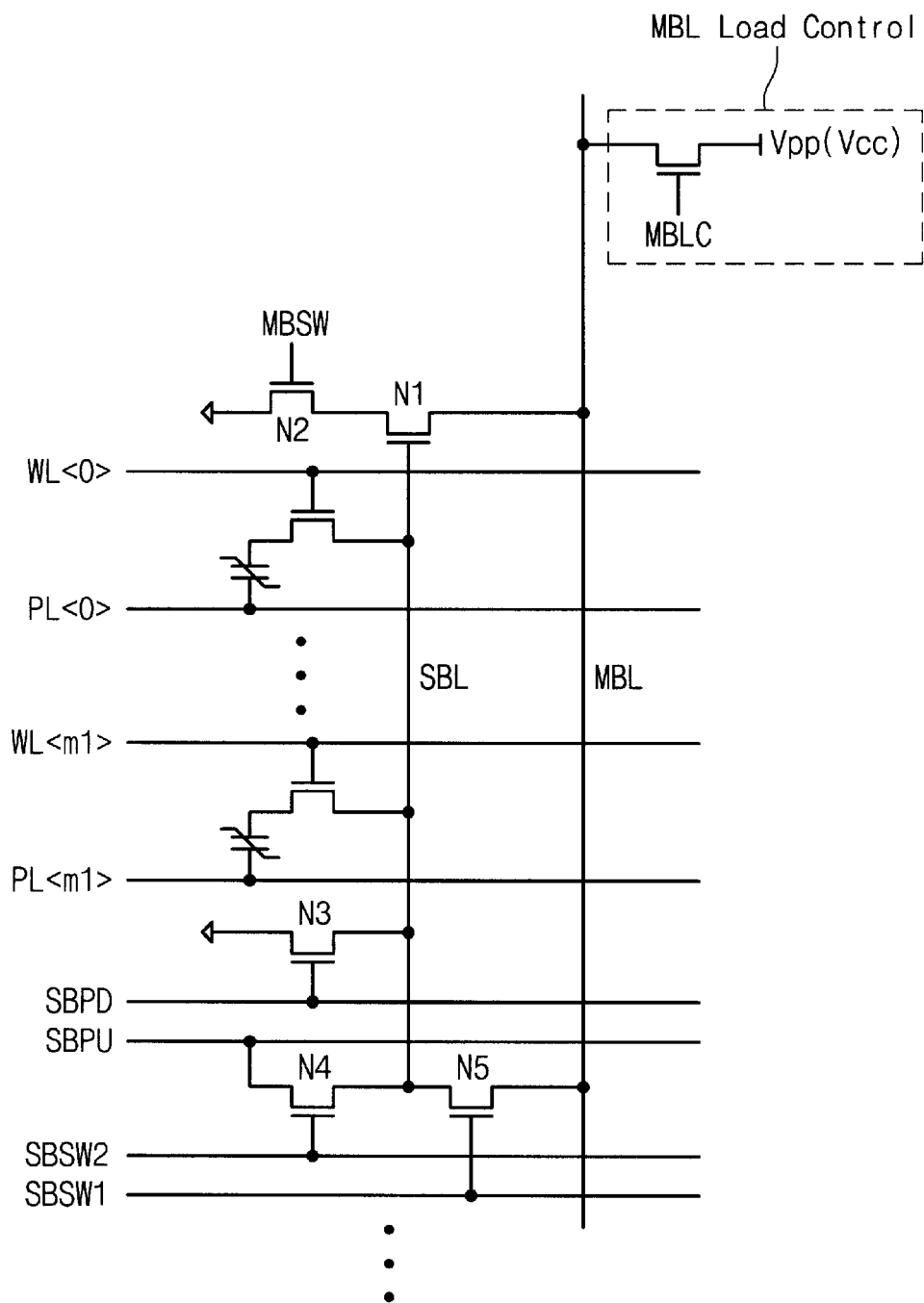
FIG. 9 is a structural diagram illustrating a sub-cell block and the main bitline load controller of the ferroelectric memory device in accordance with a preferred embodiment of the present invention.

FIG. 9 is a structural diagram illustrating a sub-cell block and the main bitline load controller.

The sub-cell block comprises a sub-bitline SBL, a NMOS transistor N1 for controlling current, a NMOS transistor N2, a NMOS transistor N3, a NMOS transistor N4 and a NMOS transistor N5. The sub-bitline is connected in common to a plurality of unit memory cells connected to each wordline WL<m> and plateline PL<m>. The NMOS transistor N1 for controlling current has a gate connected to a first terminal of the sub-bitline SBL and a drain connected to a main bitline MBL. The NMOS transistor N2 has a gate whereto a control signal MBSW is inputted, a drain coupled with the source of the NMOS transistor N1 and a source connected to the ground. The NMOS transistor N3 has a gate whereto a control signal SBPD is inputted, a drain connected to a second terminal of the sub-bitline SBL and a source connected to the ground. The NMOS transistor N4 has a gate whereto a control signal SBSW2 is inputted, a drain connected to a second terminal of the sub-bitline SBL and a source whereto a control signal SBPU is inputted. The NMOS transistor N5 has a gate whereto a control signal SBSW1 is inputted, a drain connected to the main bitline and a source connected to a second terminal of the sub-bitline SBL.

When a specific cell is approached, a sub-bitline is connected to a main bitline by activating the NMOS transistor N5 included in the sub-cell block including a specific cell. As a result, a bitline driving load is reduced to a driving load of one sub-bitline SBL.

The sub-bitline SBL pulls down a potential of the sub-bitline SBL to a ground level when the control signal SBPD of the pull-down NMOS transistor N3 is enabled.

The SBPU signal is to regulate a power voltage supplied to the sub-bitline SBL. When a "high" voltage is required in a low voltage, the SBPU signal generates a voltage higher than a Vcc and then supplies the voltage to the sub-bitline SBL.

The control signals SBSW1 and SBSW2 are to regulate the signal flow between the SBPU signal and the sub-bitline SBL. A plurality of unit cells are connected to the sub-bitline SBL.

The sub-bitline SBL connected to the gate of the NMOS transistor N1 regulates sensing voltages of the main bitline MBL. The source of the NMOS transistor N1 is connected to the drain of the NMOS transistor N2 having a gate whereto a control signal MBSW is inputted.

Figure 10:
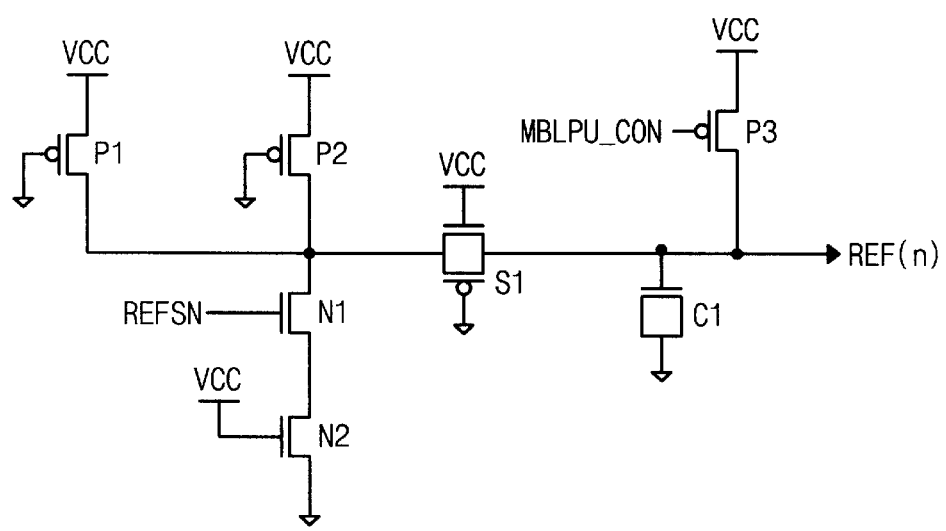
FIG. 10 is a circuit diagram illustrating a reference voltage generator of the ferroelectric memory device in accordance with a preferred embodiment of the present invention.

FIG. 10 is a circuit diagram illustrating a reference voltage generator for outputting a reference voltage REF(n)

The reference voltage generating means comprises a PMOS transistor P1, a PMOS transistor P2, a NMOS transistor N1, a NMOS transistor N2, a PMOS transistor P3, a switch S1 of on-state and a capacitor C1. The PMOS transistor P1 has a gate connected to the ground and a source connected to a positive power VCC. The PMOS transistor P2 has a gate connected to the ground, a source connected to a positive power VCC and a drain connected to the drain of the PMOS transistor P1. The NMOS transistor N1 has a gate whereto a reference level control signal REFSN is inputted and a drain connected to the drain of the PMOS transistor P1. The NMOS transistor N2 has a gate connected to a positive power VCC, a drain connected to the source of the NMOS transistor N1 and a source connected to the ground. The PMOS transistor P3 has a gate whereto a control signal MBLPU_CON is inputted and a source connected a positive power VCC. The switch S1 of on-state is connected between the drain of the PMOS transistor P1 and the drain of the PMOS transistor P3. The capacitor C1 is connected between the drain and the ground of the PMOS transistor P3. Here, a reference voltage REF(n) is outputted from the drain of the PMOS transistor P3.

The reference voltage generating means includes elements corresponding to each element of the sub-cell block to make the operation condition similar to that of the sub-cell block of the present invention.

The PMOS transistors P1 and P2 correspond to the main bitline load controller, and the PMOS transistor P3 corresponds to the main bitline pull-up controller. The NMOS transistor N2 corresponds to the NMOS transistor N2 of the sub-cell block of FIG. 9. The sensing voltage of the sub-bitline SBL is a reference level control signal REFSN. The NMOS transistor N1 corresponds to the NMOS transistor N1 of the sub-cell block of FIG. 9. The switch s1 corresponds to the column selection controller of each block. The size of all devices is identical with that of parts corresponding to the sub-cell block. A NMOS capacitor device c1 is added to regulate RC delay.

Figure 11:
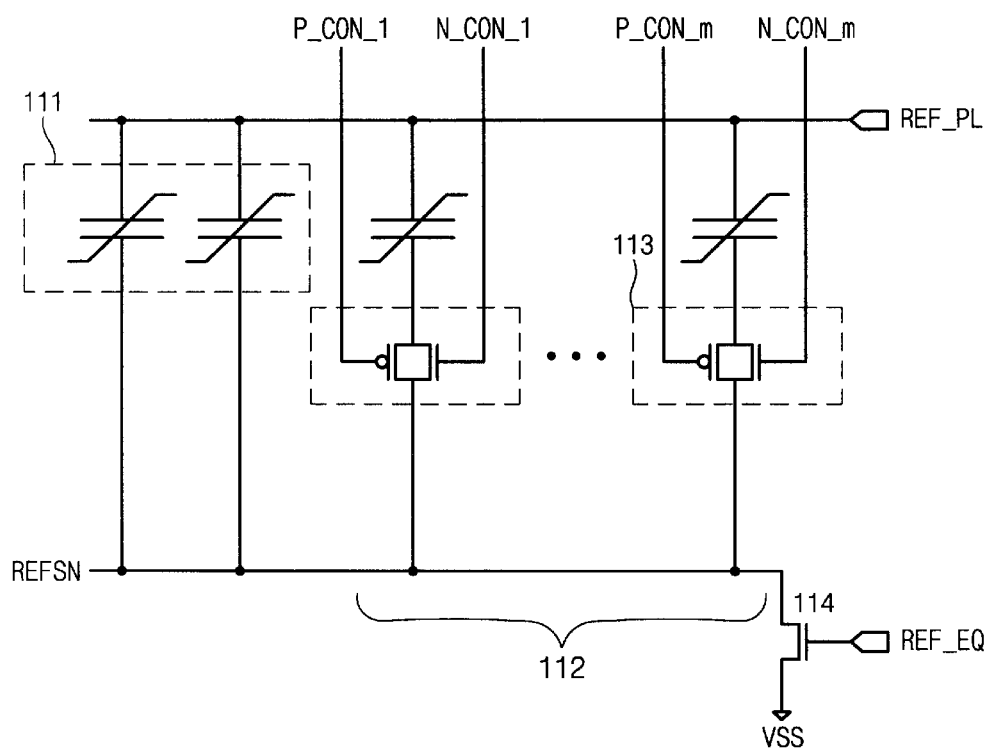
FIG. 11 is a structural diagram illustrating a reference capacitance regulator of the ferroelectric memory device in accordance with a preferred embodiment of the present invention.

FIG. 11 is a structural diagram illustrating a reference programming means for generating a reference level control signal REFSN supplied to the reference voltage output unit shown in FIG. 10.

The reference programming means comprises a driving voltage generator (not shown), a NMOS transistor 114, a plurality of ferroelectric capacitors 111 and a capacitance regulator 112. The driving voltage generator supplies a driving voltage REF_PL by pumping a power voltage. The NMOS transistor 114 has a gate whereto a control signal REF_EQ is inputted and a source connected to the ground. The plurality of ferroelectric capacitors 111 are connected between the drain of the NMOS transistor 114 and the output line of the driving voltage generator. The capacitance regulator regulates capacitance between the drain of the NMOS transistor 114 and the output line of the driving voltage generator.

The capacitance regulator 112 comprises a plurality of pairs of a ferroelectric capacitor and a switch 113 connected in series between the drain of the NMOS transistor 114 and the output line of the driving voltage generator.

A programmable register controls on/off of the switch, by its output which can be programmed by controlling input signals. The program results may be read again because they are maintained without power.

Accordingly, the capacitance between the output line REF_PL of the driving voltage generator and the NMOS transistor 114 can be controlled by input signals of the programmable register. As a result, a reference level control signal REFSN is regulated and then a reference voltage is regulated by the reference level control signal REFSN.

Figure 12:
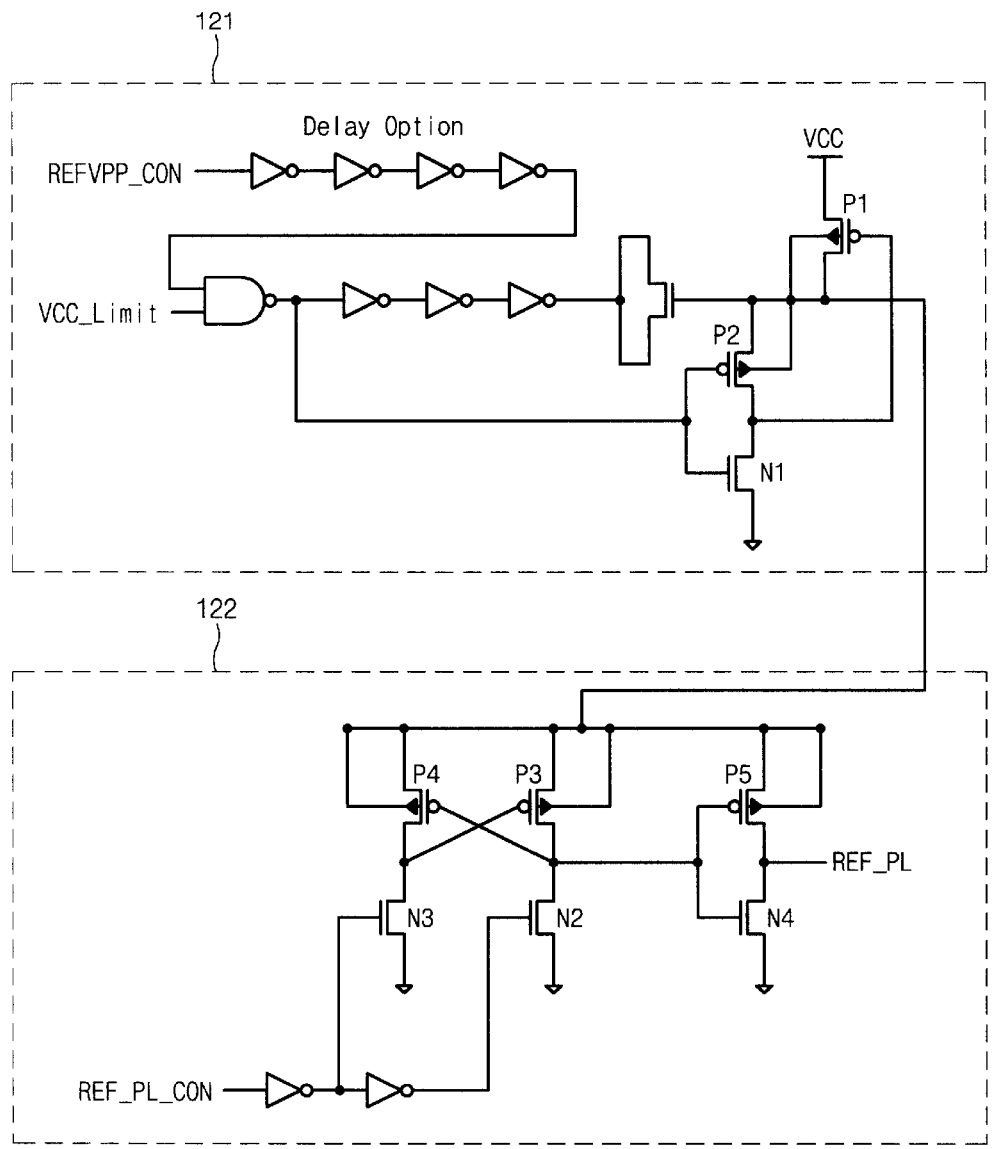
FIG. 12 is a structural diagram illustrating a driver of a reference programming means of the ferroelectric memory device in accordance with a preferred embodiment of the present invention.

FIG. 12 is a structural diagram illustrating a driving voltage generator for supplying a driving voltage REF_PL to the reference programming means shown in FIG. 11.

The driving voltage generator comprises a power voltage pumping unit 121 and a level shifter 122. The power voltage pumping unit 121 pumps and outputs a power voltage when the power voltage is below a predetermined voltage. The level shifter 122 outputs a voltage having a level outputted from the power voltage pumping unit or a ground level voltage in response to an external control signal REF_PL_CON.

The power voltage pumping unit 121 comprises a NAND gate, an inverter chain, a NMOS capacitor NC, a PMOS transistor P1, a PMOS transistor P2 and a NMOS transistor N1. The NAND gate outputs a "low" signal when both control signals VCC_Limit and REFVPP_CON are enabled. The VCC_Limit is enabled when a power voltage is below a predetermined level and the REFVPP_CON is enabled when a power voltage pumping is commanded. The inverter chain comprises the odd number of inverters, and a input unit is connected to an output node of the NAND gate. The NMOS capacitor NC has a first electrode connected to an output node of the inverter chain. The PMOS transistor P1 has a source connected to a positive power voltage and a drain connected to a second electrode of the NMOS transistor. The PMOS transistor P2 has a gate connected to the output unit of the NAND gate, a source connected to the second electrode of the NMOS capacitor and a drain connected to the gate of the PMOS transistor P1. The NMOS transistor N1 has a gate connected to the output unit of the NAND gate, a source connected to the ground and a drain connected to the drain of the PMOS transistor P2.

When the power voltage VCC is over a threshold voltage, the control signal VCC_Limit is at a "low" level to inhibit the pumping operation. When the signal is at a "low" level, an output of the NAND gate is "high" and the transistors N1 and P1 are turned-on. As a result, an output voltage becomes VCC.

When the power voltage VCC is below a threshold voltage, the control signal VCC_Limit is at a "high" level and performs the pumping operation according to the control signal REFVPP_CON.

When the control signal REFVPP_CON transits from a "low" to "high" level, the output of the NAND gate transits from a "high" to "low" level.

Due to the inverter chain, a pulse transiting from a "low" to "high" level is transmitted to the NMOS transistor with some delay.

When a "high" pulse is transmitted to the NMOS capacitor, the transistors N1 and P1 has been turned-off. As a result, a voltage amounting to the voltage between both ends of the NMOS capacitor is pumped.

The level shifter 122 comprises a PMOS transistor P3, a PMOS transistor P4, a NMOS transistor N2, a NMOS transistor N3, a PMOS transistor P5 and NMOS transistor N4. The PMOS transistor P3 has a source connected to the second electrode of the NMOS capacitor. The PMOS transistor P4 has a gate connected to the drain of the PMOS transistor P3, a source connected to the second electrode of the NMOS capacitor and a drain connected to the gate of the PMOS transistor. The NMOS transistor N2 has a gate whereto an external signal REF_PL_CON is inputted, a drain coupled with the drain of the PMOS transistor P3 and a source connected to the ground. The NMOS transistor N3 has a gate whereto a signal having the opposite level to the external signal REF_PL_CON is inputted, a drain coupled with the drain of the PMOS transistor P4 and a source connected to the ground. The PMOS transistor P5 has a gate connected to the drain of the NMOS transistor and a source connected to an output line of the power voltage pumping unit. The NMOS transistor N4 has a gate connected to the drain of the NMOS transistor N2, a source connected to the ground and a drain coupled with the drain of the PMOS transistor P5. A driving voltage REF_PL is outputted from the drain of the NMOS transistor N4.

When the control signal REF_PL_CON is at a "low" level, the transistors N3, P3 and N4 are turned-on and then the output voltage REF_PL becomes at a "low" level. When the control signal REF_PL_CON is at a "high" level, the transistors N2, P4 and PS are turned-on, the output voltage REF_PL becomes a power voltage or a pumped power voltage.

Figure 13:
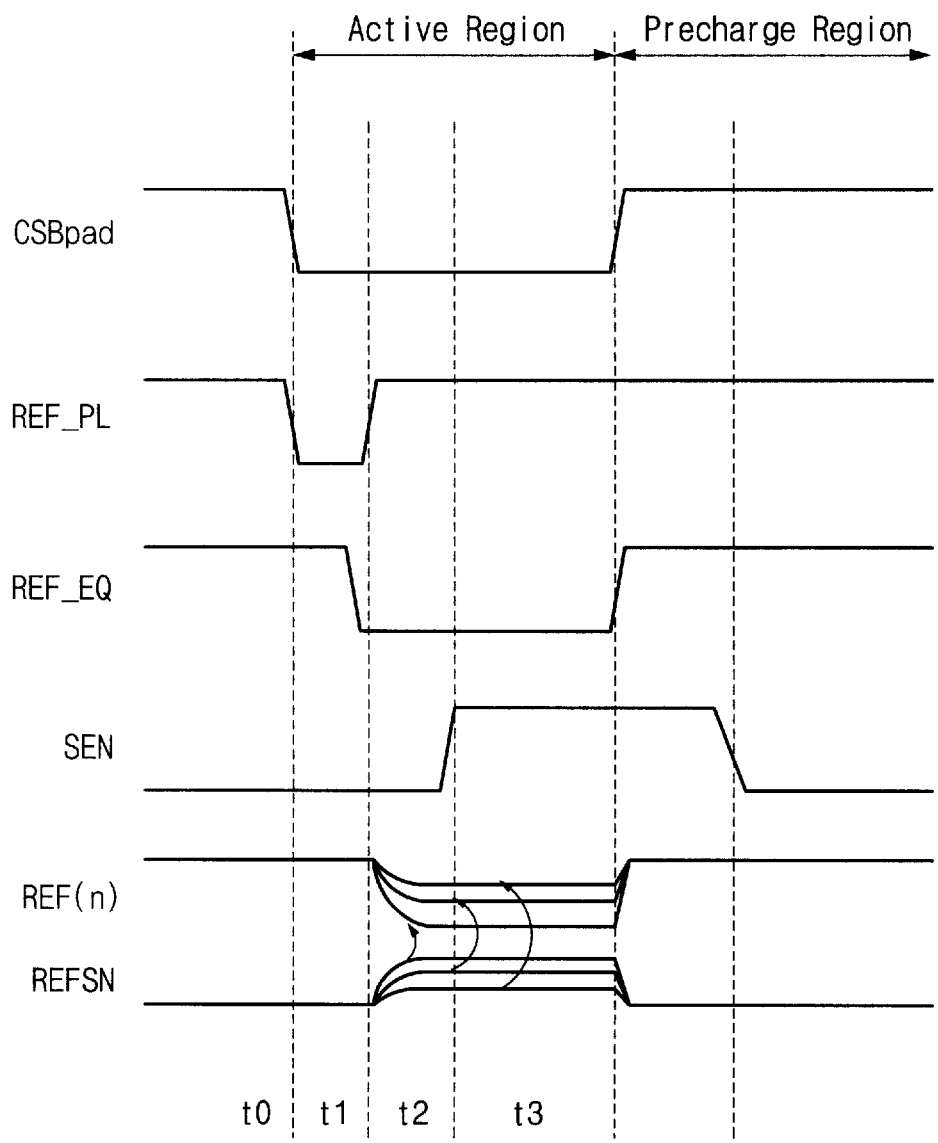
FIG. 13 is a timing diagram of the reference generator of the ferroelectric memory device in accordance with a preferred embodiment of the present invention.

FIG. 13 is a timing diagram of the reference voltage generator. A reference charge is charged in a ferroelectric capacitor in the interval t1 and a reference voltage REF(n) is generated in the interval t2.

In the interval t2, capacitance determines the level of the reference level control signal REFSN. The level of the reference voltage REF(n) is determined according to the level of the reference level control signal REFSN.

As the voltage level of the reference level control signal REFSN becomes higher, the amount of current flowing through the NMOS transistor N1 of FIG. 10 also increases. As a result, the voltage drop across the PMOS transistors P1 and P2 is increased, thereby decreasing the reference voltage REF(n).

Figure 14:
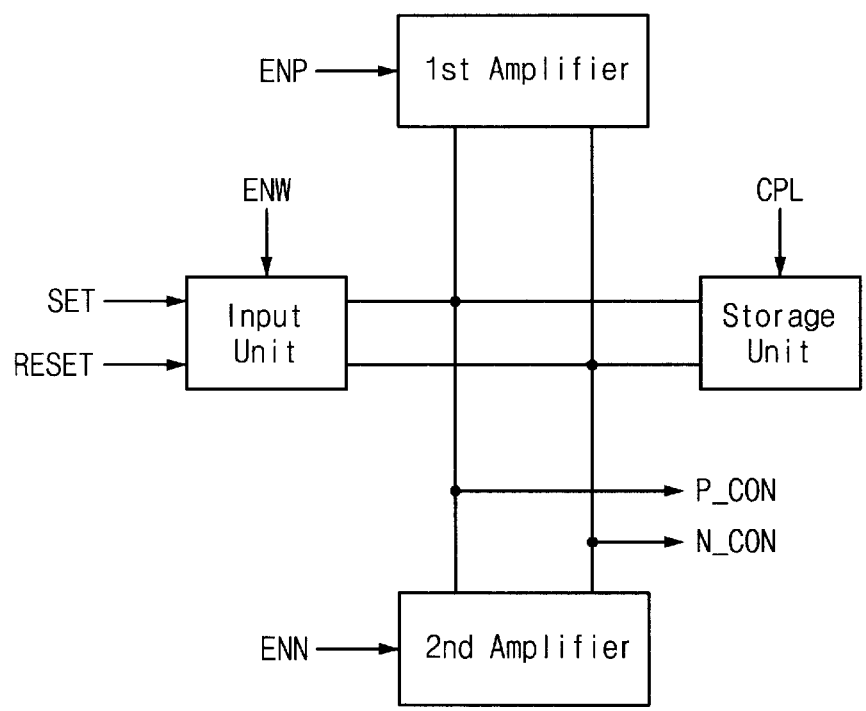
FIG. 14 is a block diagram illustrating a programmable register of the ferroelectric memory device in accordance with a preferred embodiment of the present invention.

FIG. 14 is a block diagram illustrating a programmable register.

The programmable register comprises a first amplifier, an input unit, a storage unit and a second amplifier.

The first and the second amplifiers operate when control signals ENP and ENN are enabled. The first and second amplifiers fix voltages of two electrodes connected to the storage unit at a predetermined value or amplify signals stored in the storage unit to output the signals into external output nodes P_CON and N_CON.

The input unit supplies a predetermined voltage to two electrodes connected to the storage unit according to input signals SET and RESET when a control signal ENW is enabled. The supplied voltage is fixed by the first and the second amplifiers as described above. However, when the control signal ENW is disabled, the two electrodes connected to the storage unit are separated from the input signals SET and RESET.

The storage unit stores inputted signals and maintains the signals without power to output the stored signals thereafter. In the present invention, a ferroelectric capacitor used for the storage means maintains recorded information even when the power is blocked.

Figure 15:
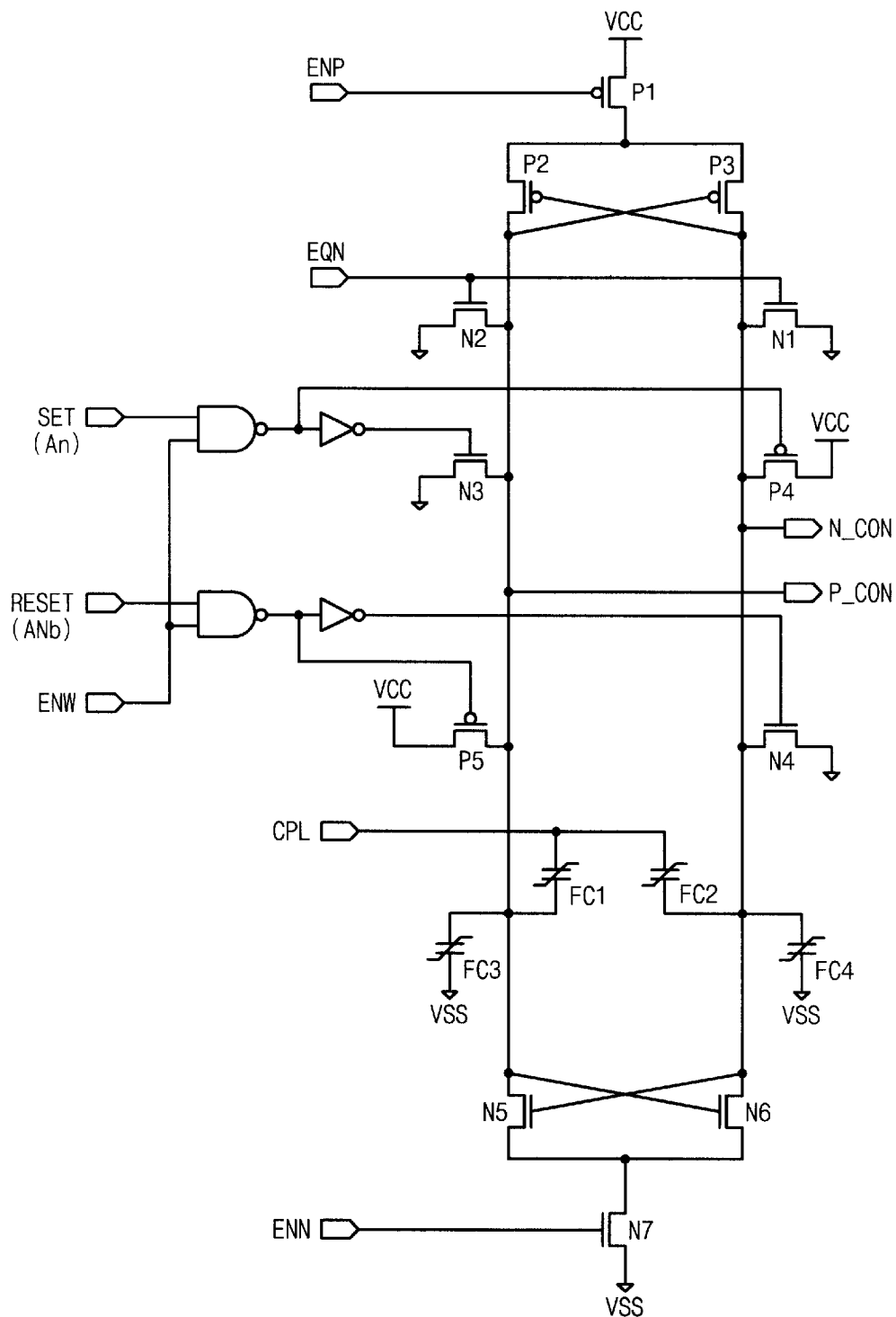
FIG. 15 is a circuit diagram illustrating a programmable register of the ferroelectric memory device in accordance with a preferred embodiment of the present invention.

FIG. 15 is a circuit diagram illustrating each component of the programmable register.

The first amplifier comprises PMOS transistors P1, P2 and P3. The PMOS transistor P1 has a gate whereto a control signal ENP is inputted and a source connected to a positive power. The PMOS transistor P2 has a gate connected to a first electrode of the first amplifier, a source connected to the drain of the PMOS transistor and a drain connected to a second electrode of the first amplifier. The PMOS transistor P3 has a gate connected to the second electrode of the first amplifier, a source connected to the drain of the PMOS transistor P1 and a drain connected to the first electrode of the first amplifier.

The input unit comprises a NMOS transistor N3, a PMOS transistor P4, a PMOS transistor P5 and a NMOS transistor N4. The NMOS transistor N3 has a gate whereto an AND operation result of a first input signal SET and a control signal ENW is inputted, a drain connected to the first electrode of the first amplifier and a source connected to the ground. The PMOS transistor P4 has a gate whereto a NAND operation result of a first input signal SET and a control signal ENW is inputted, a drain connected to the second electrode of the first amplifier and a source connected to a positive power VCC. The PMOS transistor P5 has a gate whereto a NAND operation result of a second input signal RESET and a control signal ENW is inputted, a drain connected to the first electrode of the first amplifier and a source connected to a positive power VCC. The NMOS transistor N4 has a gate whereto an AND operation result of a second input signal RESET and a control signal ENW, a drain connected to the second electrode of the first amplifier and a source connected to the ground.

The storage unit comprises ferroelectric capacitors FC1, FC2, FC3 and FC4. The first ferroelectric capacitor FC1 has a first electrode whereto a control signal CPL is inputted and a second electrode connected to the first electrode of the first amplifier. The ferroelectric capacitor FC2 has a first electrode whereto a control signal CPL is inputted and a second electrode connected to the second electrode of the first amplifier. The ferroelectric capacitor FC3 has a electrode connected to the first electrode of the first amplifier and a second electrode connected to the ground. The ferroelectric capacitor EC4 has a first electrode connected to the second electrode of the first amplifier and a second electrode connected to the ground.

The second amplifier comprises NMOS transistors N5, N6 and N7. The NMOS transistor N5 has a gate connected to the second electrode of the first amplifier and a drain connected to the first electrode of the first amplifier. The NMOS transistor N6 has a gate connected to the first electrode of the first amplifier and a drain connected to the second electrode of the first amplifier. The NMOS transistor N7 has a gate whereto a control signal ENN is inputted, a drain connected to the sources of the NMOS transistors N5 and N6 and a source connected to the ground.

The programmable register also comprises NMOS transistors N1 and N2. The NMOS transistor N1 has a gate whereto a control signal EQN is inputted, a drain coupled with the drain of the PMOS transistor P2 and a source connected to the ground. The NMOS transistor N2 has a gate whereto a control signal EQN is inputted, a drain coupled with the drain of the PMOS transistor P3 and a source connected to the ground.

Figure 16:
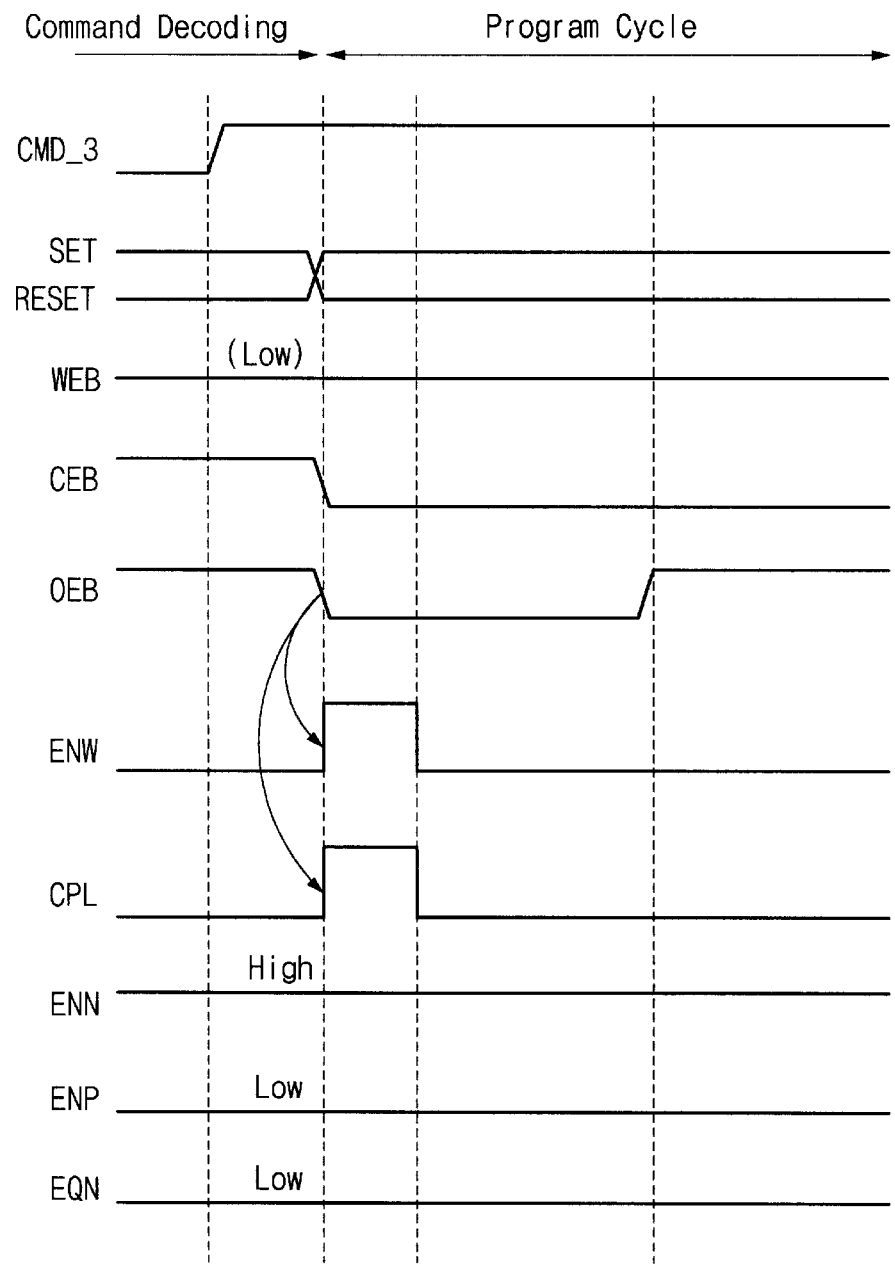
FIG. 16 is a timing diagram of the programmable register during the program of ferroelectric memory device in accordance with a preferred embodiment of the present invention.

FIG. 16 is a timing diagram illustrating the operation of the programmable register.

When a predetermined program mode is started, a program mode operation signal CMD_3 is enabled. Here, a circuit is operated by enabling control signals ENN and ENP and then an input voltage is prepared by disabling a control signal EQN.

When control signals ENW and CPL are enabled, input signals SET and RESET are provided to a ferroelectric capacitor. For example, When an input signal SET is at a "high" level and an input signal RESET is at a "low" level, a charge is stored in ferroelectric capacitors FC1 and FC4.

When a control signal ENW is at a "low" level, input signals SET and RESET are separated from ferroelectric capacitors FC1, FC2, FC3 and FC4. When a control signal CPL is at a "low" level, the amount of charge varies in the ferroelectric capacitors FC1 and FC2.

When power is blocked, charges are re-distributed in the ferroelectric capacitors FC1, FC2, FC3 and FC4. Here, the voltage of output node P_CON becomes lower than that of output node N_CON due to the stored charge.

Figure 17:
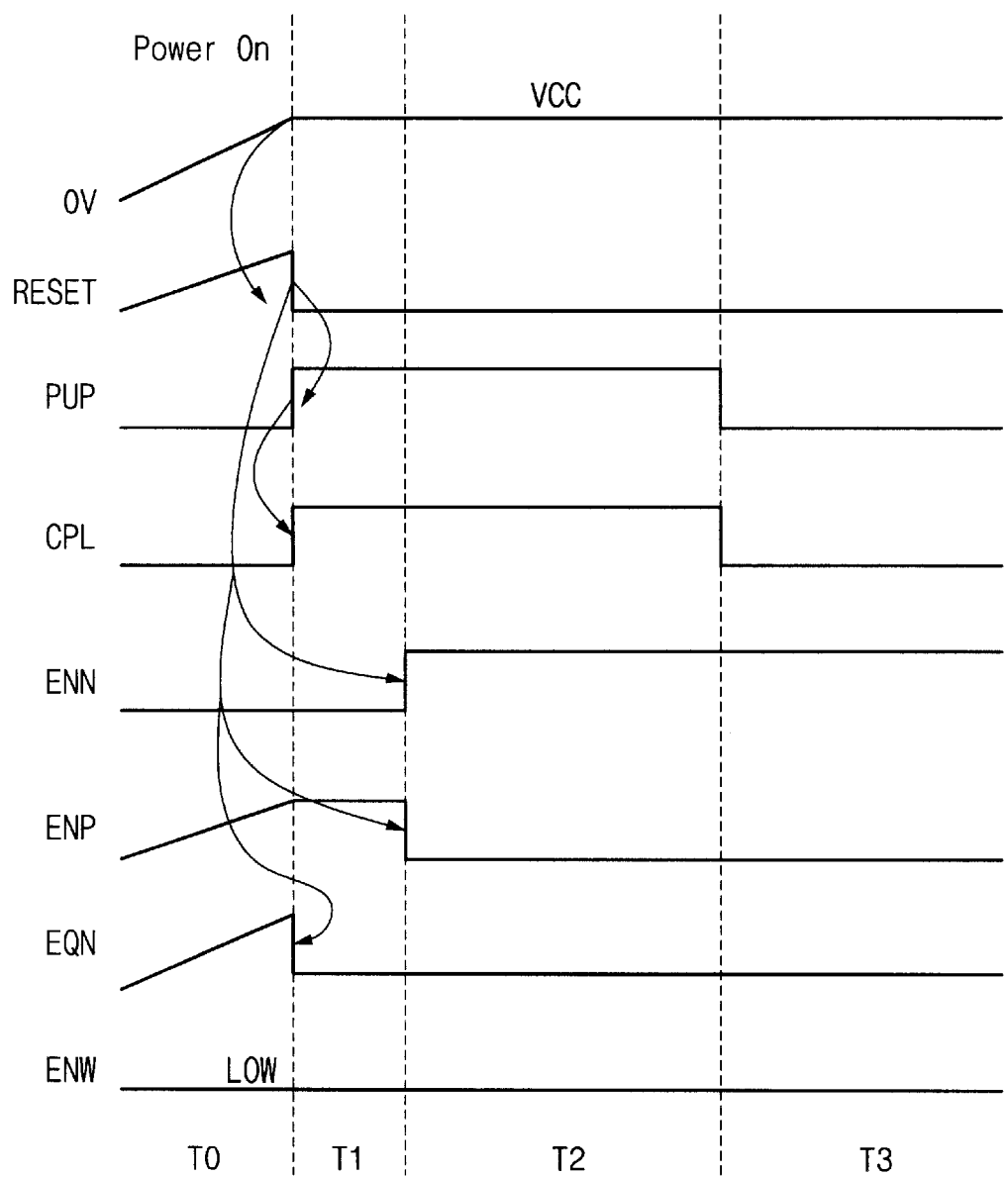
FIG. 17 is a timing diagram of the programmable register during the power-up mode of ferroelectric memory device in accordance with a preferred embodiment of the present invention.

FIG. 17 is a timing diagram illustrating the operation of the programmable register when power is on.

When the power reaches a stabilized level, a power-up detection pulse PUP is generated. A control signal EQN transits from a "high" to "low" level due to the signal PUP. Then, charges stored in the ferroelectric capacitors FC1, FC2, FC3 and FC4 generate potential difference between output nodes N_CON and P_CON. Here, the voltage of output node N_CON is high.

When enough potential difference is generated, control signals ENN and ENP are enabled to "high" and "low" levels, respectively. Then, the first and the second amplifiers amplify data of both nodes in the storage unit.

After completion of amplification, the control signal CPL re-transits to a "low" level and then "high" data destroyed in the ferroelectric capacitors FC2 and FC4 are recovered. Here, the control signal ENW is disabled to a "low" level to inhibit re-writing of external data.

Figure 18:
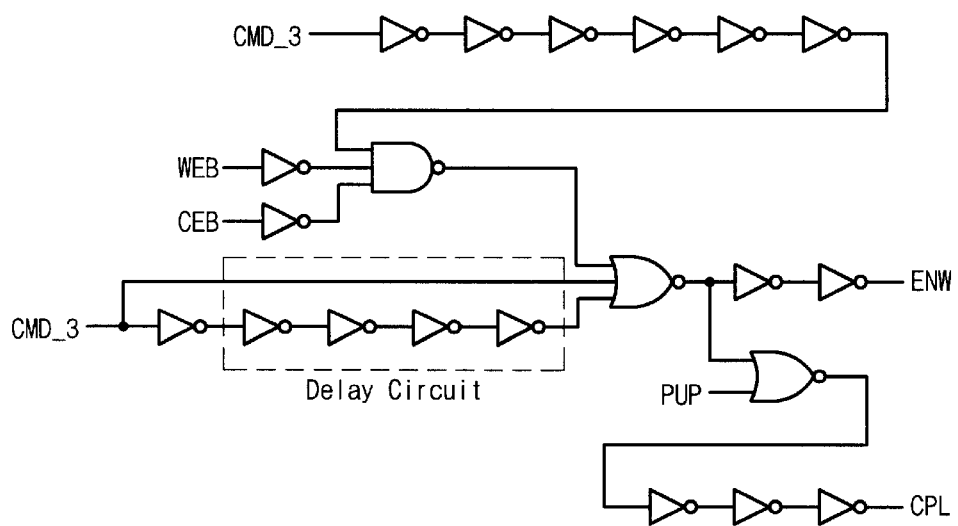
FIG. 18 is a structural diagram illustrating control signals CPL and ENW inputted into the programmable register when the ferroelectric memory device of the present invention is programmed.

FIG. 18 is a structural diagram illustrating an example of the circuit for generating control signals CPL and ENW. The specific explanation on FIG. 18 will be omitted because the operation of this circuit can be easily understood by a person having an ordinary skill in the art referring to FIGS. 16 and 17.

Figure 19:
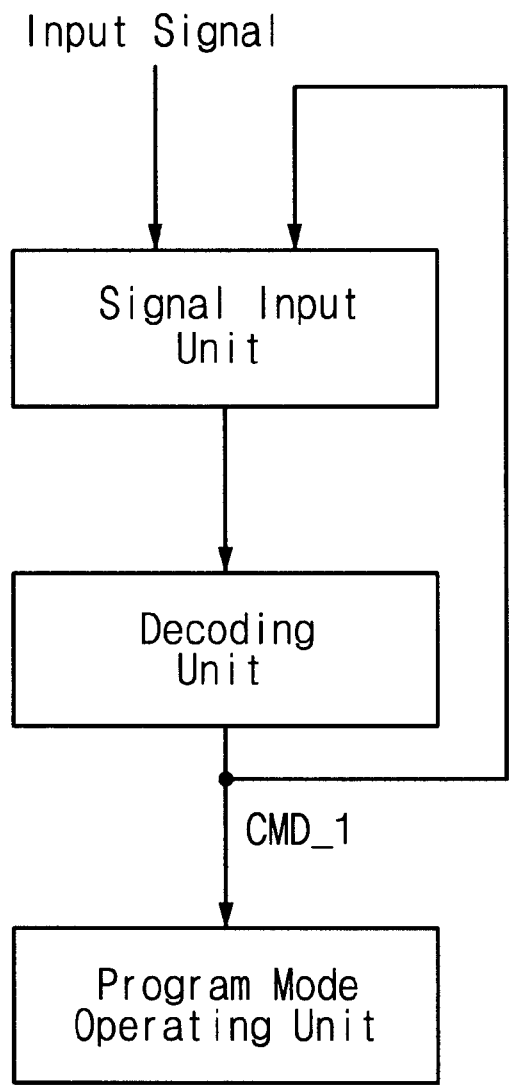
FIG. 19 is a block diagram illustrating a circuit for setting a program mode of the ferroelectric memory device in accordance with a preferred embodiment of the present invention.

FIG. 19 is a block diagram illustrating a circuit for setting a program mode of the ferroelectric memory comprising a reference programming means for regulating and outputting voltages of reference level control signals by using a programmable register, which programs the level of output signal by externally applied signals and maintains the program result without power, to output a reference voltage according to the reference level control signals by controlling on/off of switches regulating capacitance of capacitors connected between driving power and a reference voltage generating means.

A method for processing the program comprises the steps of: decoding signals inputted in a signal input unit; activating a program mode operating signal CMD_1 corresponding to a predetermined program mode and deactivating the signal input unit; and performing the program mode in response to the program mode operating signal CMD_1.

The program mode of the present invention comprises a row redundancy program mode, a column redundancy program mode and a reference level program mode. If necessary, other program modes may be added. Here, a CMD_1 activates a row redundancy program mode, a CMD_2 activates a column redundancy program mode and a CMD_3 activates a reference level program mode. These signals are fed back to a signal input unit. When each signal is enabled to a "high" level, the input of the signal input unit is blocked, thereby securing the stability.

Figure 20A:
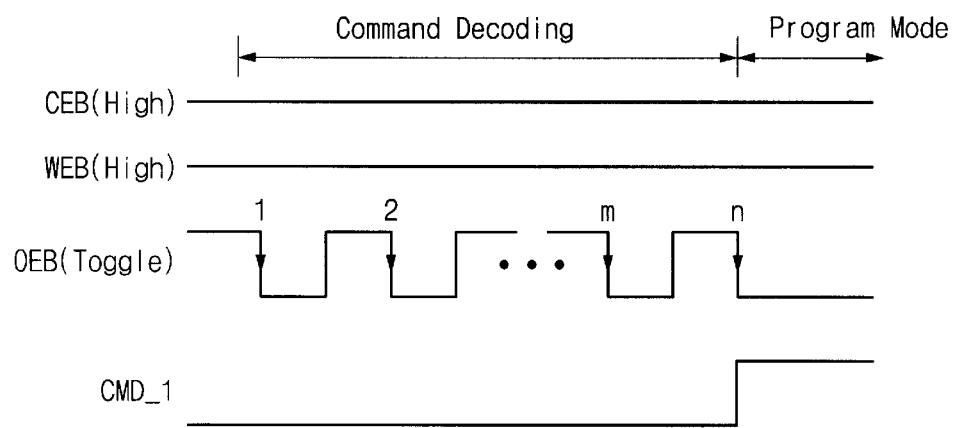
FIGS. 20a to 20c are timing diagrams of a decoder during the program mode of the ferroelectric memory device in accordance with a preferred embodiment of the present invention.
Figure 20B:
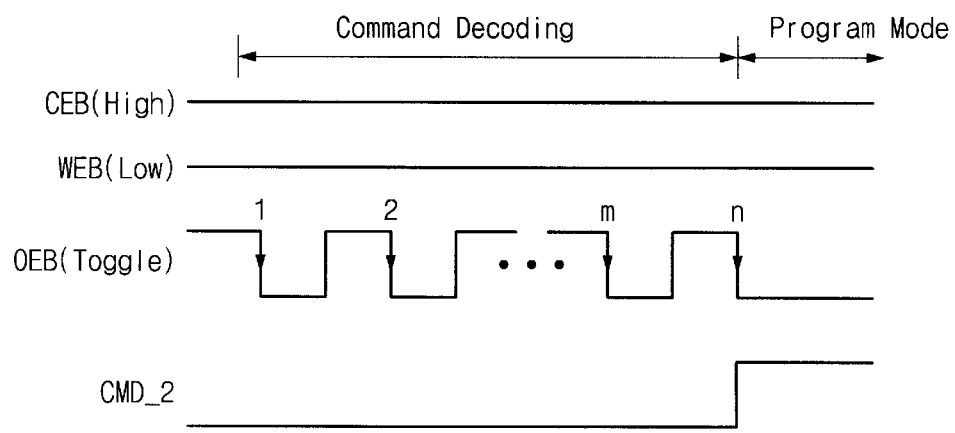
Figure 20C:
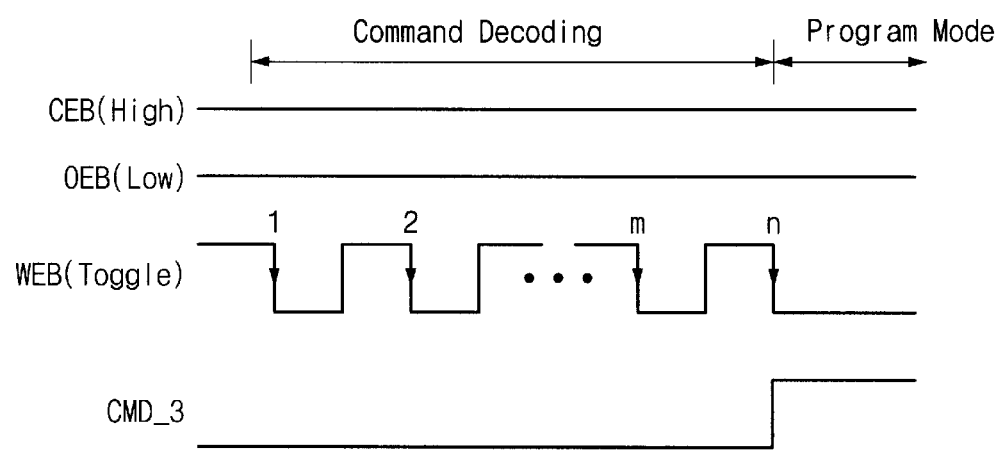

FIGS. 20a to 20c are timing diagrams illustrating the operation of a decoder.

The CMD_1 is enabled to a "high" level at a $n^{th}$ falling edge of output enable signal OEB while a chip enable signal CEB and a write enable signal WEB are held at "high" levels.

The CMD_2 is enabled to a "high" level at a $n^{th}$ falling edge of output enable signal OEB while the CEB is held at a "high" level and the WEB at a "low" level.

The CMD_3 is enabled to a "high" level at a $n^{th}$ falling edge of write enable signal WEB while the CEB is held at a "high" level and the OEB at a "low" level.

Figure 21:
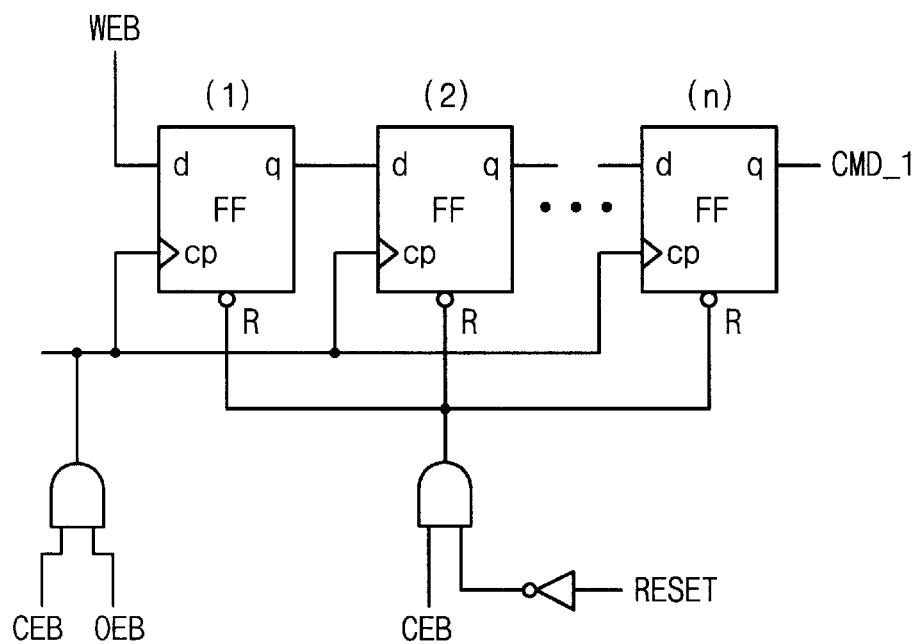
FIG. 21 is a structural diagram illustrating a Command_1 processor of the ferroelectric memory device in accordance with a preferred embodiment of the present invention.
Figure 22:
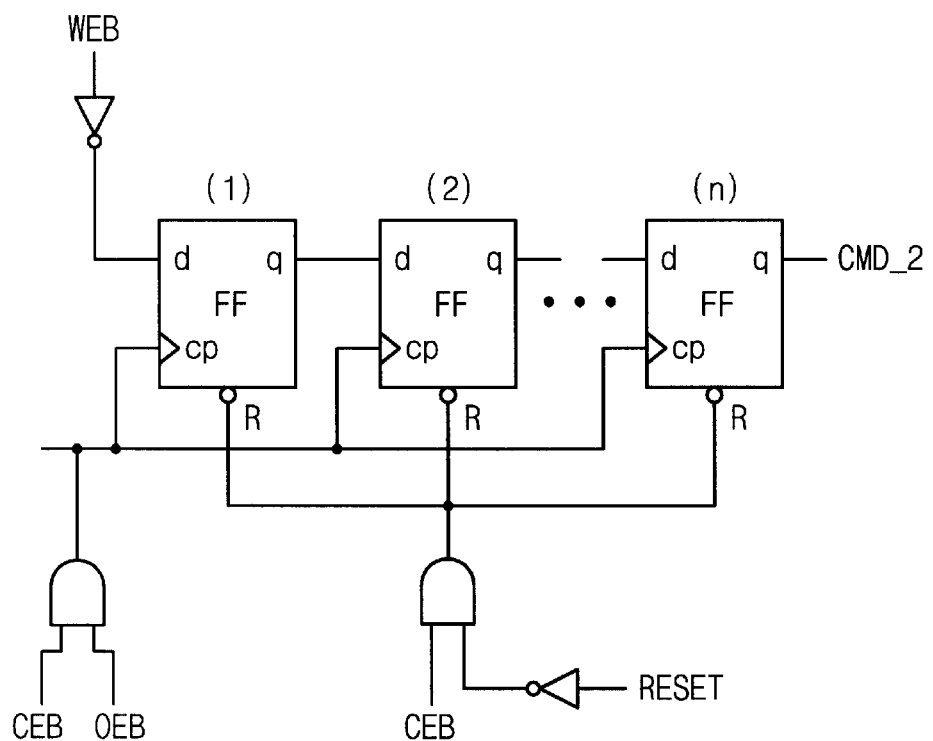
FIG. 22 is a structural diagram illustrating a Command_2 processor of the ferroelectric memory device in accordance with a preferred embodiment of the present invention.
Figure 23:
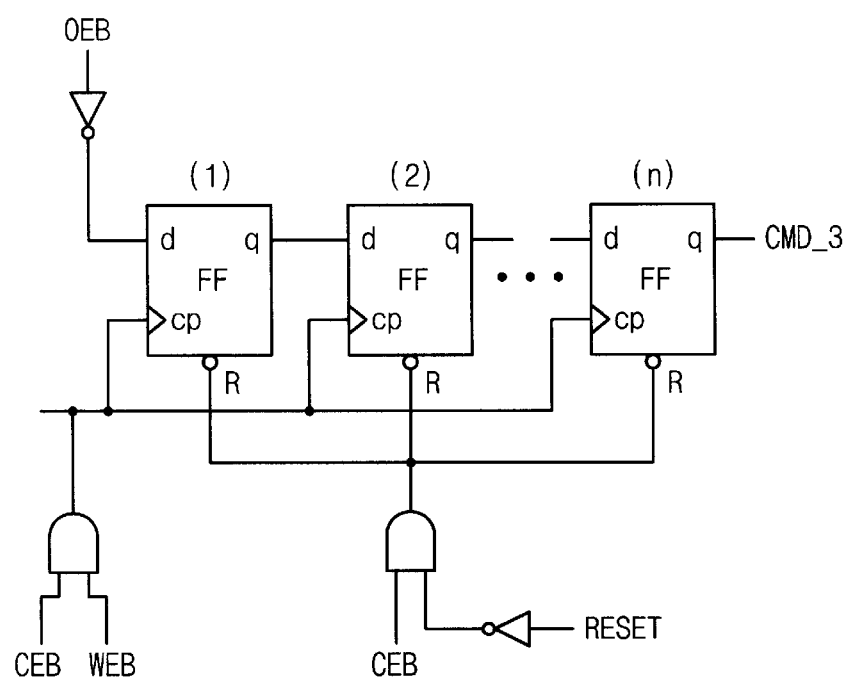
FIG. 23 is a structural diagram illustrating a Command_3 processor of the ferroelectric memory device in accordance with a preferred embodiment of the present invention.

FIGS. 21 to 23 are structural diagrams illustrating the circuit for generating CMD_1 to CMD_3, respectively.

FIG. 21 is a structural diagram illustrating the circuit for generating the CMD_1. The CMD_1 for activating a row redundancy program mode is enabled by decoding input signals CEB, OEB and WEB. When a chip enable signal CEB is at a "high" level, if the output enable signal OEB toggles, then the result of AND operation between the chip enable signal CEB and the output enable signal OEB also toggles. If the output enable signal OEB toggles n times, an output of the $n^{th}$ D flip-flop has the same level of the write enable signal WEB. Accordingly, when the write enable signal WEB is applied to a "high" level, the output of CMD_1 becomes "high".

The operations of the circuit shown in FIGS. 22 and 23 will be omitted because they are identical with the operation of FIG. 21.

Figure 24:
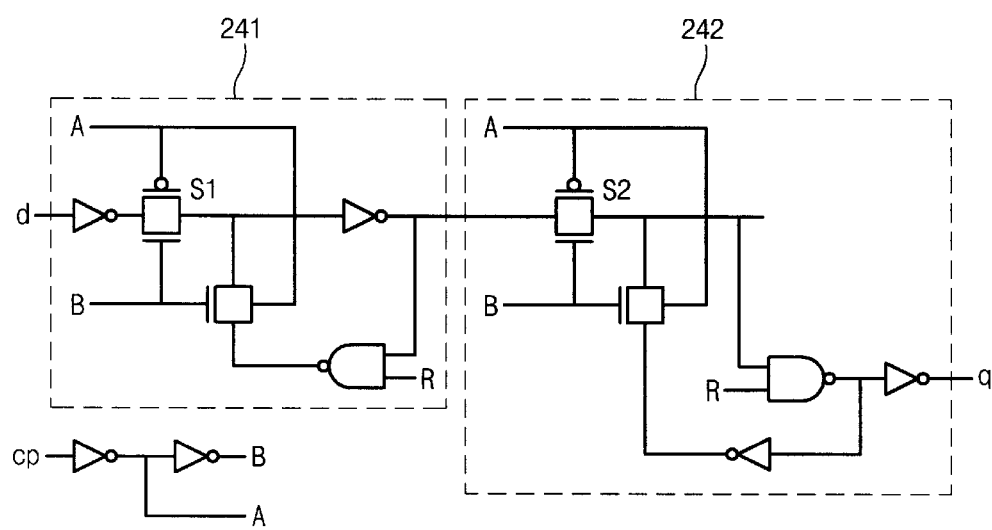
FIG. 24 is a detail structural diagram illustrating a flip-flop circuit of the decoder of the ferroelectric memory device in accordance with a preferred embodiment of the present invention.

FIG. 24 is a detail structural diagram illustrating a D flip-flop circuit shown in FIGS. 21 to 23.

Generally, a D flip-flop is a circuit for sampling and outputting a signal supplied to an input terminal at the edges of a clock signal.

The circuit is synchronized to falling edges of clock and sampling an input signal d. A master unit 241 opens a switch S1 therein and stores an input signal d in a latch when the clock signal is at a "high" level. Here, because a slave unit 242 closes a switch S2 therein, the input signal d is not transmitted to a latch in the slave unit 242.

When a clock moves to a "low" level, the switch S1 of the master unit 241 is closed but the switch S2 of the slave unit 242 is open. As a result, the data stored in the latch of the master unit 241 is stored in the latch of the slave unit 242, and then the signal stored in the latch of the slave unit 242 is continuously outputted until the next falling edge of the clock.

Figure 25A:
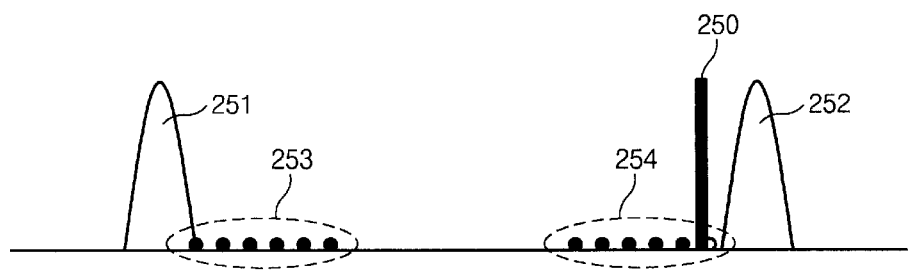
FIGS. 25a to 25c are diagrams illustrating the rescue sequence of weak cells of ferroelectric memory device in accordance with a preferred embodiment of the present invention.
Figure 25B:
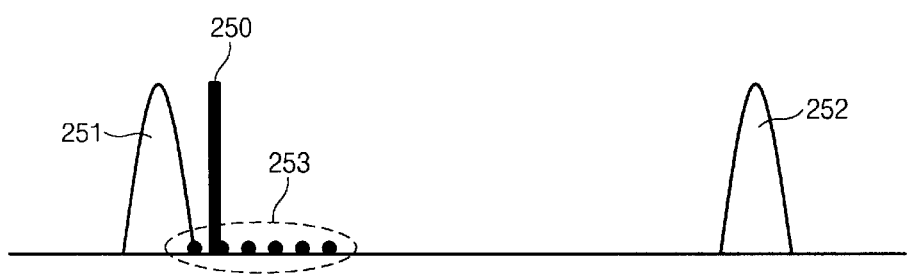
Figure 25C:
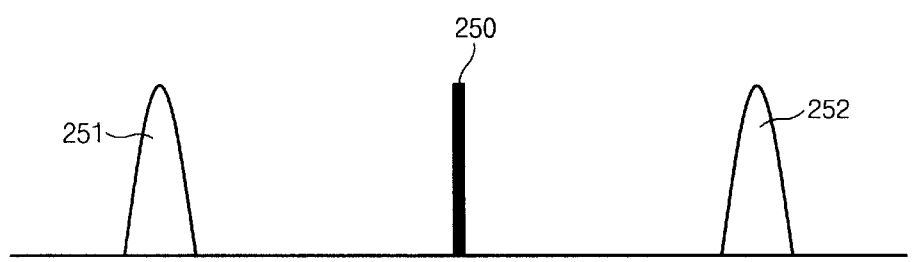

FIGS. 25a to 25c are diagrams illustrating a method for finding and rescuing weak cells by regulating reference voltages in the ferroelectric memory device comprising a reference programming means for regulating and outputting voltages of reference level control signals by using a programmable register, which programs the level of output signal by externally applied signals and maintains the program result without power, to output reference voltages according to the reference level control signals by controlling on/off of switches regulating capacitance of capacitors connected between driving power and a reference voltage generating means and a redundant address decoder including a programmable register which controls on/off of the switches used for programming redundant addresses.

The method for rescuing weak cells includes the steps of: setting a reference voltage 250 at a predetermined first level; performing a redundancy program for the weak cells 254 which include data of below the first level among cells set to include data of the first level; setting the reference voltage 250 at a second level lower than the first level; performing a redundancy program for the weak cells 253 which include data of over the second level among cells set to include data of the second level; and setting the reference voltage 250 in the middle of the first level 252 and the second level 251.

As described above, the level REF(n) of the reference voltage is obtained by regulating the capacitance to vary the reference level control signal REFSN. Here, the reference level control signal REFSN may be regulated by using a programmable register for controlling on/off of switch connected in series to capacitors to regulate the capacitance.

Generally, a redundancy program is to program a fuse attached to a redundant address decoder. In the preferred embodiment of the present invention, switches are used instead of fuses and output signals of the programmable register are used as signals for controlling on/off of switches. As a result, the on/off of switches may be readjusted anytime.

After completion of the redundancy program, the reference level is re-programmed to be placed in the middle of the first level and the second level to secure the maximum sensing margin.

The disclosed ferroelectric memory device may variably regulates reference voltages by using the programmable register in the reference generator. The register controls on/off of switches for programming the redundant decoder. Due to this programmable register, addresses of redundant cells may be recovered when they are decoded in error, thereby improving reliability and yield of chips.

What is claimed is:

1. A ferroelectric memory device, comprising:
   a reference programming means for regulating and outputting a reference level control signal by using a programmable register, which programs a level of output signal by externally applied signals and maintains the program result without power, to control on/off of switch regulating capacitance of capacitors connected to driving power; and
   a reference voltage generating means for outputting a reference voltage according to the reference level control signal.

2. The device according to claim 1, wherein the reference programming means comprises:
   a driving voltage generator for providing driving voltage by pumping power voltage;
   a NMOS transistor having a gate applied to a first control signal and a source connected to the ground;
   a plurality of ferroelectric capacitors connected between a drain of the NMOS transistor and an output line of the driving voltage generator; and
   a capacitance regulator for regulating capacitance between the drain of the NMOS transistor and the output line of the driving voltage generator.

3. The device according to claim 2, wherein the driving voltage generator comprises:
   a power voltage pumping unit for pumping and outputting power voltage when power voltage is below a predetermined voltage; and
   a level shifter unit for outputting voltage of the level outputted from the power voltage pumping unit or voltage of the ground level in response to an external control signal.

4. The device according to claim 3, wherein the power voltage pumping unit comprises:
   a first processor for outputting a "low" signal when a first control signal below a predetermined level of power voltage and a second control signal indicating pumping power voltage are both enabled;
   an inverter chain having an input node connected to Lan output node of the first processor and comprising an odd number of inverters;
   a capacitor connected having a first electrode connected to an output node of the inverter chains;
   a first PMOS transistor having a source connected positive power voltage and a drain connected to a second electrode of the capacitor;
   a second PMOS transistor having a gate connected to output unit of the first processor, a source connected to the second electrode of the capacitor and a drain connected to the gate of the first PMOS transistor; and
   a NMOS transistor having a gate connected to output unit of the first processor, a source connected to the ground and a drain connected to the drain of the second PMOS transistor, wherein the output voltage is outputted from the second electrode of the capacitor.

5. The device according to claim 3, wherein the level shifter unit comprises:
 a first PMOS transistor having a source connected to an output line of the power voltage pumping unit;
 a second PMOS transistor having a gate connected to a drain of the first PMOS transistor, a source connected to the output line of the power voltage pumping unit and a drain connected to the gate of the first PMOS transistor;
 a first NMOS transistor having a gate applied to external signals, a drain connected to the drain of the first PMOS transistor and a source connected to the ground;
 a second NMOS transistor having a gate applied to a signal having the opposite level to the external signals, a drain connected to the drain of the second PMOS transistor and a source connected to the ground;
 a third PMOS transistor having a gate connected to the drain of the second NMOS transistor and a source connected to output line of the power voltage pumping unit; and
 a third NMOS transistor having a gate connected to the drain of the second NMOS transistor, a source connected to the ground and a drain connected to the drain of the third PMOS transistor,
 wherein output voltage is provided from the drain of the third NMOS transistor.

6. The device according to claim 2, wherein the capacitance regulator includes plural pairs of ferroelectric capacitor and switch connected in series between the drain of the NMOS transistor and the output line of the driving voltage generator, wherein the on/off of the switch is regulated by the programmable register, respectively.

7. The device according to claim 1, wherein the reference voltage generating means comprises:
 a first PMOS transistor having a gate connected to the ground and a source connected to positive power;
 a second PMOS transistor having a gate connected to the ground, a source connected to positive power and a drain connected to a drain of the first PMOS transistor;
 a first NMOS transistor having a gate applied to the reference level signal and a drain connected to the drain of the first PMOS transistor;
 a second NMOS transistor having a gate connected to positive power, a drain connected to the source of the first NMOS transistor and a source connected to the ground;
 a third PMOS transistor having a gate applied to control signals and a source connected to positive power;
 a on-switch connected between the drain of the first PMOS transistor and a drain of the third PMOS transistor; and
 a capacitor connected between the drain of the third PMOS transistor and the ground,
 wherein the reference voltage is identical with the drain voltage of the third PMOS transistor.

8. The device according to claim 1, wherein the programmable register comprises:
 a first amplifier receiving a first control signal, and having a first electrode for outputting a first output signal and a second electrode for outputting a second output signal;
 an input unit receiving a second control signal, a first input signal and a second input signal, and having a first electrode connected to the first electrode of the first amplifier and a second electrode connected to the second electrode of the first amplifier;
 a storage unit receiving a third control signal, and having a first electrode connected to the first electrode of the first amplifier and a second electrode connected to the second electrode of the first amplifier; and
 a second amplifier receiving a fourth control signal, and having a first electrode connected to the first electrode of the first amplifier and a second electrode connected to the second electrode of the first amplifier.

9. The device according to claim 8, wherein the programmable register further comprises:
 a first NMOS transistor having a gate applied to a fifth control signal, a drain connected to the second electrode of the first amplifier and a source connected to the ground; and
 a second NMOS transistor having a gate applied to a fifth control signal, a drain connected to the first electrode of the first amplifier and a source connected to the ground.

10. The device according to claim 8, wherein the first amplifier comprises: a first PMOS transistor having a gate applied to the first control signal and a source connected to positive power; a second PMOS transistor having a gate connected to the first electrode of the first amplifier, a source connected to the drain of the first PMOS transistor and a drain connected to the second electrode of the first amplifier; and a third PMOS transistor having a gate connected to the second electrode of the first amplifier, a source connected to the drain of the first PMOS transistor and a drain connected to the first electrode of the first amplifier.

11. The device according to claim 8, wherein the input unit comprises:
 a third NMOS transistor having a gate applied an AND operation result of the first input signal and the second control signal, a drain connected to the first electrode of the first amplifier and a source connected to the ground; a fourth PMOS transistor having a gate applied to the NAND operation result of the first input signal and the second control signal, a drain connected to the second electrode of the first amplifier and a source connected to positive power; a fifth PMOS transistor having a gate applied to the NAND operation result of the second input signal and the second control signal, a drain connected to the first electrode of the first amplifier and a source connected to positive power; and a fourth NMOS transistor having a gate applied to an AND operation result of the second input signal and the second control signal, a drain connected to the second electrode of the first amplifier and a source connected to the ground.

12. The device according to claim 8, wherein the storage unit comprises: a first ferroelectric capacitor having a first electrode applied to the third control signal and a second electrode connected to the first electrode of the first amplifier; a second ferroelectric capacitor having a first electrode applied to the third control signal and a second electrode connected to the second electrode of the first amplifier; a third ferroelectric capacitor having a first electrode connected to the first electrode of the first amplifier and a second electrode connected to the ground; and a fourth ferroelectric capacitor having a first electrode connected to the second electrode of the first amplifier and a second electrode connected to the ground.

13. The device according to claim 8, wherein the second amplifier comprises: a fifth NMOS transistor having a gate connected to the second electrode of the first amplifier and a drain connected to the first electrode of the first amplifier; a sixth NMOS transistor having a gate connected to the first electrode of the first amplifier and a drain connected to the second electrode of the first amplifier; and a seventh NMOS transistor having a gate applied to the fourth control signal, a drain connected to the drains of the fifth and the sixth NMOS transistors and a source connected to the ground.

14. A method of programming a ferroelectric memory device comprising a reference generator for regulating the level of reference voltage by using a programmable register, which programs the level of output signals by externally applied signals and maintains the program result without power, to control the on/off of switches regulating the capacitance of capacitors connected to driving power and a redundant decoder using the programmable register as on/off controller of a switch for programming redundant address program, including the steps of:

decoding signals inputted in a signal input unit;

activating program mode operating a signal corresponding to the program mode and deactivating the signal input unit; and performing the program mode in response to the program mode operating signal.

15. The method according to claim 14, wherein the program mode includes a row redundancy program mode, a column redundancy program mode and a reference level program mode.

16. The method according to claim 15, wherein the row redundancy program mode is activated when a chip enable signal is inactivated, a write enable signal is inactivated and an output enable signal toggles N times.

17. The method according to claim 15, wherein the column redundancy program mode is activated when a chip enable signal is inactivated, a write enable signal is inactivated and an output enable signal toggles N times.

18. The method according to claim 15, wherein the reference program mode is activated when a chip enable signal is inactivated, a write enable signal is inactivated and an output enable signal toggles N times.

19. A method of programming a ferroelectric memory device comprising a reference generator for regulating the level of reference voltage by using a programmable register, which programs the level of output signal by externally applied signals and maintains the program result without power, to control the on/off of switches regulating the capacitance of capacitors connected to driving power and a redundant decoder using the programmable register as on/off controller of a switch for programming redundant address program, including the steps of:

setting a reference voltage at a predetermined first level;

performing a redundancy program for weak cells, which include data of below the first level among cells set to include data of the first level;

setting the reference voltage at a second level lower than the first level;

performing a redundancy program for weak cells, which include data of over the second level among cells set to include data of the second level; and setting the reference voltage in the middle of the predetermined first level and the predetermined second level.

20. The method according to claim 19, wherein the redundancy program comprises the steps of:

determining addresses of redundant cells to replace the weak cells; and programming the on/off of the switches included in the redundant address decoder by controlling input signals of the programmable register for the redundant cells to be selected when addresses of the weak cells are inputted.

* * * * *